United States Patent [19]

McCall et al.

[11] Patent Number: 5,656,952
[45] Date of Patent: Aug. 12, 1997

[54] ALL-MOS DIFFERENTIAL HIGH SPEED OUTPUT DRIVER FOR PROVIDING POSITIVE-ECL LEVELS INTO A VARIABLE LOAD IMPEDANCE

[75] Inventors: Kevin J. McCall, Leominster; David Reynolds, Georgetown, both of Mass.

[73] Assignee: Analog Devices, Inc., Wilmington, Mass.

[21] Appl. No.: 558,010

[22] Filed: Nov. 13, 1995

[51] Int. Cl.[6] .................................................. H03K 19/00
[52] U.S. Cl. ............................. 326/82; 326/27; 326/34; 326/68
[58] Field of Search ........................... 326/21, 26, 27, 326/34, 63, 68, 73, 115, 121, 82

[56] References Cited

U.S. PATENT DOCUMENTS

| | | | |
|---|---|---|---|
| 4,841,175 | 6/1989 | De Man et al. | 326/34 X |
| 4,999,519 | 3/1991 | Kitsukawa et al. | 326/21 X |
| 5,124,580 | 6/1992 | Matthews et al. | 326/34 X |
| 5,146,112 | 9/1992 | Ito et al. | 326/27 X |
| 5,149,992 | 9/1992 | Allstot et al. | 326/115 |
| 5,541,532 | 7/1996 | McCall | 326/68 |

OTHER PUBLICATIONS

1992 Special Linear Reference Manual Analog Devices: Chapter 5, pp. 29–30.

*Primary Examiner*—David R. Hudspeth
*Attorney, Agent, or Firm*—Fish & Richardson, P.C.

[57] ABSTRACT

According to embodiments of the present invention, a driver circuit, has first and second reference voltage rails for receiving first and second reference voltages, has first and second inputs for receiving an input differential signal and has first and second outputs for providing an output differential signal. The driver circuit comprises a first CMOS transistor, a second CMOS transistor, and first, second and third current sources. Positive voltage levels with respect to ground at the first and second outputs, are within typical acceptable ECL output voltage levels.

22 Claims, 5 Drawing Sheets

ALL-MOS DIFFERENTIAL HIGH SPEED OUTPUT DRIVER FOR PROVIDING POSITIVE-ECL LEVELS INTO A VARIABLE LOAD IMPEDANCE

BACKGROUND OF THE INVENTION

1. Field of the Invention

The present invention relates generally to differential output drivers, and more particularly to an apparatus for providing positive-ECL levels into a variable load impedance using all Metal Oxide Semiconductor (MOS) technology.

2. Discussion of the Related Art

Until recently, high speed analog designs typically were implemented using bipolar transistor technology using Emitter Coupled Logic (ECL). However, because of improved performance of Complementary Metal Oxide Semiconductor (CMOS) transistors, the use of CMOS technology in high speed analog designs has steadily increased. The use of both CMOS and bipolar technologies in high speed analog designs has created a need for interface circuits which provide an interface between CMOS circuits and bipolar circuits operating at ECL signal levels. In the past, this interface has been provided using bipolar-CMOS (BiCMOS) technology with bipolar devices used in the output drivers of BiCMOS circuits to provide ECL signal levels to bipolar circuits.

Figure 1:
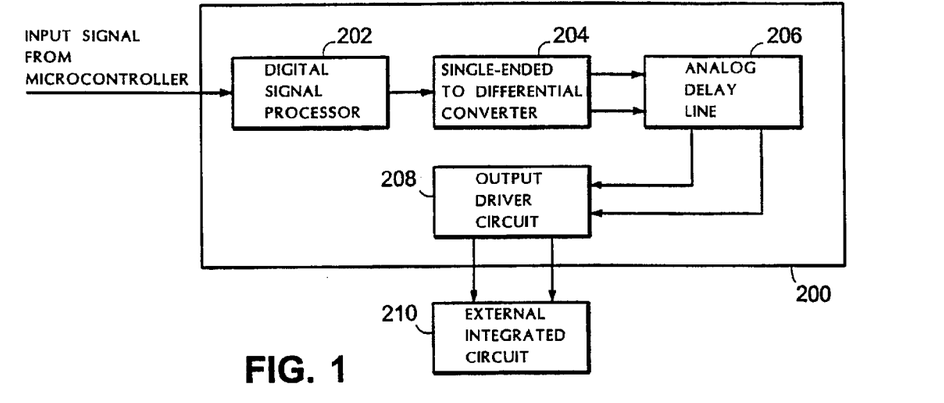
FIG. 1 is a block diagram of a BiCMOS integrated circuit.

FIG. 1 shows a disk drive read/write integrated circuit 200 that receives a digital input signal from an external source, e.g., a microcontroller, and provides an output signal to an external bipolar integrated circuit 210. The integrated circuit 200 includes a digital signal processor 202, a single-ended-to-differential level converter 204, an analog delay line 206, and an output driver circuit 208, connected in cascade, that provide interface signals to the external bipolar integrated circuit 210. The output driver circuit 208 provides bipolar ECL signal levels to conform to the input requirements of the external bipolar integrated circuit 210. The integrated circuit 200 is implemented using BiCMOS technology so that the output driver circuit 208 can be implemented using bipolar devices to provide ECL signal levels to the external integrated circuit 210, while the other circuits of the integrated circuit 200 are implemented using CMOS technology.

Figure 2:
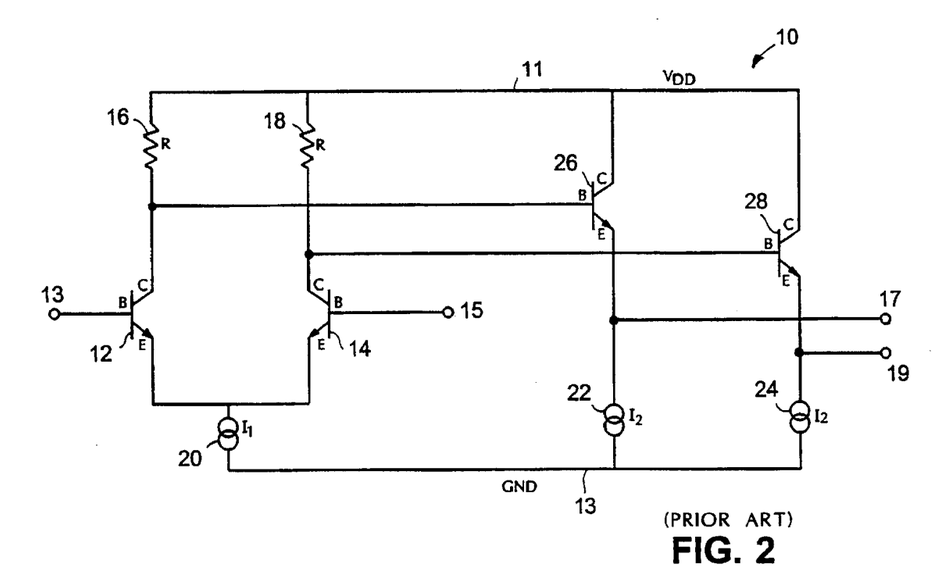
FIG. 2 is a schematic diagram of a prior art bipolar high speed output driver circuit.

FIG. 2 shows a conventional differential high speed output driver circuit 10 implemented with bipolar technology that could be used as the driver circuit 210 in FIG. 1. The driver circuit 10 includes a voltage supply rail 11 for connecting to a reference voltage $V_{DD}$ and a ground rail 13 for connecting to a ground reference GND. The driver circuit of FIG. 2 includes a pair of matched NPN bipolar transistors 12 and 14 each having an emitter E, a collector C and a base B. The emitters E of transistors 12 and 14 are connected together, and also to the ground rail 13 through a current source 20 that generates a current $I_1$. The collector of transistor 12 is connected to the voltage supply rail 11 through a resistor 16 having a resistance value of R, and the collector of transistor 14 is connected through a resistor 18, also having a resistance value of R, to the voltage supply rail 11. The base of transistor 12 is connected to a negative input terminal 13 to receive the negative component $V_{NIN}$ of a differential signal, and the base of transistor 14 is connected to a positive input terminal 15 to receive the positive component $V_{PIN}$ of a differential signal.

The output driver circuit 10 also includes bipolar NPN transistors 26 and 28 each having an emitter E, a collector C and a base B. The collector of transistor 26 is coupled to the voltage supply rail 11, the emitter of transistor 26 is connected to the ground rail 13 through a current source 22 that generates a drive current $I_2$, and the base of transistor 26 is connected to the collector C of transistor 12. The collector C of transistor 28 is connected to the voltage supply rail 11, the emitter E of transistor 28 is connected to the ground rail 13 through a current source 24 which generates a drive current $I_2$, and the base of transistor 28 is connected to the collector of transistor 14. The emitter of transistor 26 also is connected to a positive differential output terminal 17 to provide a differential output voltage $V_{POUT}$, and the emitter of transistor 28 is also connected to a negative differential output terminal 19 to provide a differential output voltage $V_{NOUT}$.

The circuit shown in FIG. 2 operates as follows. A differential input signal, having one of two polarities representing high and low states of the input signal, is applied at the input terminals 13 and 15 respectively connected to the bases of transistors 12 and 14. Depending on the polarity of the input signal, one of transistors 12 and 14 will be turned on, and the other of transistors 12 and 14 will be turned off. Equations (1) and (2) provide respectively the output voltage $V_{POUT}$ with respect to ground when the input signal is at the high state and when the input signal is at the low state.

$$(\text{HIGH}) \quad V_{POUT} = V_{DD} - V_{BE} \tag{1}$$

$$(\text{LOW}) \quad V_{POUT} = V_{DD} - I_1 R - V_{BE} \tag{2}$$

In equations (1) and (2), $V_{DD}$ represents the voltage of the supply rail, $V_{BE}$ is the base to emitter voltage of transistor 26, $I_1$ is the current that flows through resistor 16 when transistor 12 is turned on and is approximately equal to the drive current of current source 20, and R represents the resistance value of resistor 16.

The output voltage $V_{NOUT}$ at terminal 19 is opposite that at terminal 17 such that $V_{NOUT}$ is equal to the value given by equation (1) for a low state of the differential input signal and $V_{NOUT}$ is equal to the value given by equation (2) for a high state of the input differential input signal.

In conventional output bipolar driver circuits, the values of $V_{DD}$, $V_{BE}$, $I_1$ and R are selected to provide positive ECL output levels. The acceptable output positive ECL voltage levels occupy one of two voltage ranges depending on whether the output signal represents a high or a low state of the input differential signal. Typical acceptable positive ECL output voltage ranges (in volts) for a high and a low output are provided by equations (3) and (4).

$$(\text{High}) \quad V_{DD} - 0.5 \geq V_{POUT} \geq V_{DD} - 1.0 \tag{3}$$

$$(\text{Low}) \quad V_{DD} - 1.5 \geq V_{POUT} \geq V_{DD} - 2.1 \tag{4}$$

It is desirable to implement the integrated circuit 200 of FIG. 1 using only CMOS technology to reduce manufacturing costs of the integrated circuit. However, when only CMOS technology is used, bipolar devices, which are not implemented using CMOS technology, cannot be used in the output driver circuit to provide the required ECL signal levels to the external integrated circuit 210.

Figure 3:
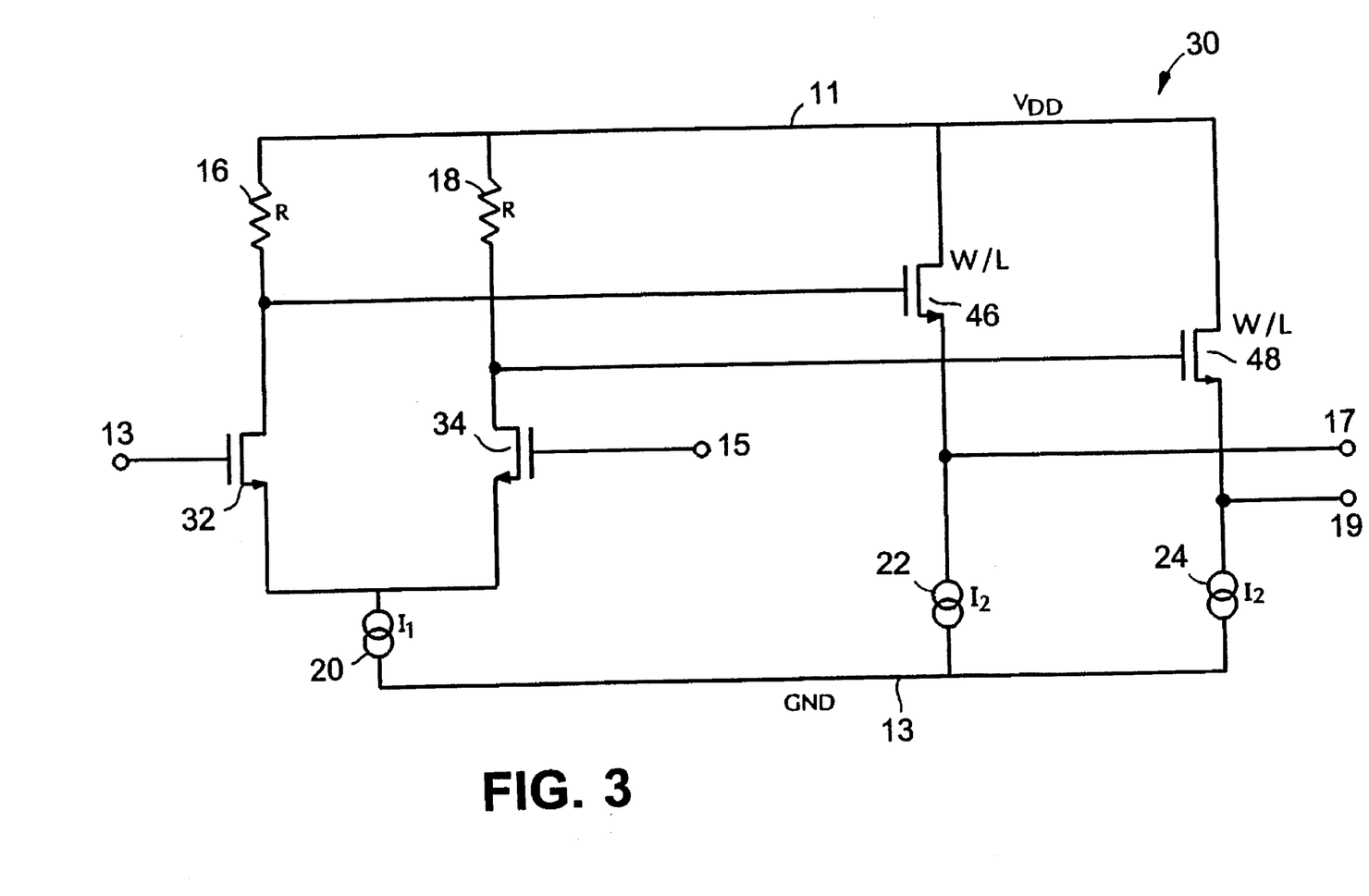
FIG. 3 is a schematic diagram showing the circuit of FIG. 1 with the bipolar transistors replaced with NMOS transistors.

FIG. 3 shows a driver circuit 30 that consists of the circuit of FIG. 2 with the bipolar transistors 12, 14, 26 and 28 replaced with NMOS transistors 32, 34, 46 and 48. As can be readily derived by one skilled in the art, the output voltages at the output terminal $V_{POUT}$ with respect to ground for the circuit shown in FIG. 4 for the high and low states are listed respectively in equations (5) and (6).

$$\text{(HIGH)} \quad V_{POUT} = V_{DD} - V_T - \sqrt{\frac{2I_2 L}{\mu_0 C_{OX} W}} - V_{BG} \quad (5)$$

$$\text{(LOW)} \quad V_{POUT} = V_{DD} - V_T - \sqrt{\frac{2I_2 L}{\mu_0 C_{OX} W}} - V_{BG} - I_2 R \quad (6)$$

In equations (5) and (6), $V_T$ is the gate to source threshold level of transistor 46, $I_1$ is the current provided by current source 20 through resistor 16, R is the resistance value of resistor 16, $V_{BG}$ is the increase in threshold voltage, $V_T$, due to the source to bulk voltage of transistor 46, and L, W, $\mu_0$, and $C_{ox}$ are respectively the majority carrier mobility, channel length, channel width, and gate capacitance per unit area of transistor 46. Using typical values of the parameters shown in equations (5) and (6), it can be determined by one skilled in the art that the circuit of FIG. 3 will not provide the typical positive ECL output levels defined by equations (3) and (4).

It is therefore an object of the present invention to provide a differential high speed output driver circuit providing typical positive ECL levels into variable load impedances using only CMOS technology.

SUMMARY OF THE INVENTION

According to one embodiment of the present invention, a driver circuit has first and second reference voltage rails for receiving first and second reference voltages, has first and second inputs for receiving a differential input signal and has first and second outputs for providing a differential output signal to a load. The driver circuit comprises a differential amplifier having first and second inputs that receive the input differential signal and first and second outputs that provide the output differential signal. Each of the first and second outputs of the differential amplifier provide an output drive current that has an output current value. The differential amplifier also has a control input that receives a control signal having a control value. The output current value of each of the first and second outputs is determined by the control value of the control signal. The driver circuit further comprises a programmable bias circuit, having an input that receives a programming signal and an output that provides the control signal. The control value of the control signal is determined by the programming signal. The output of the programmable bias circuit is coupled to the control input of the differential amplifier to provide the control signal.

In one embodiment of the present invention, the driver circuit is constructed and arranged such that the output current value provided at each of the first and second outputs of the driver circuit generates a voltage in the load that is within typical emitter coupled logic output voltage ranges. In a preferred version of this embodiment, the programmable bias circuit can be programmed to vary the output current value to accommodate different load impedance values.

In still another embodiment of the present invention, the driver circuit includes a level shifting circuit that provides a voltage level shift to the input differential signal to the driver circuit.

In yet another embodiment of the present invention, a CMOS integrated circuit comprises a processor and an output driver circuit. The output driver circuit has first and second outputs for providing an output differential signal having output drive currents to a load. The output drive currents have a programmable value such that output voltages at the load are within typical emitter coupled logic output voltage ranges. The output driver circuit is implemented using only CMOS technology.

DESCRIPTION OF THE FIGURES

For a better understanding of the present invention, reference is made to the drawings which are incorporated herein by reference and in which.

DETAILED DESCRIPTION

Figure 4:
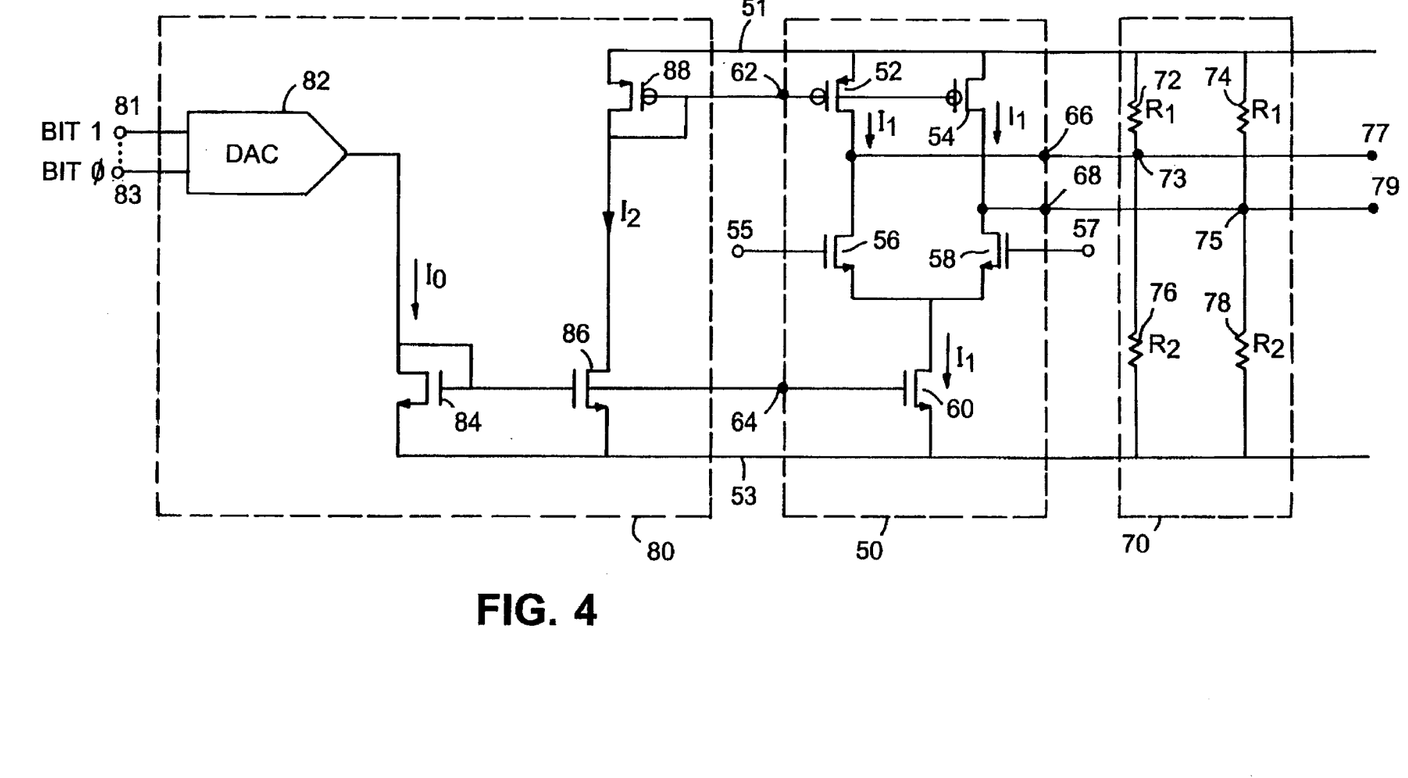
FIG. 4 is a schematic diagram of a differential high speed output driver circuit in accordance with one embodiment of the present invention.

A differential high speed output driver circuit 50 providing positive ECL levels into a variable load impedance using all MOS technology is shown in FIG. 4. The driver circuit 50 is connected to a load 70 and a bias current circuit 80 that provides a programmable bias current to the driver circuit.

The driver circuit includes a voltage supply rail 51 for connecting to a reference voltage $V_{DD}$ and a ground rail 53 for connecting to a ground reference GND. The driver circuit 50 further includes a pair of matched input NMOS transistors 56 and 58 having their sources connected together and having their gates respectively connected to a positive input terminal 55 for receiving a positive differential input voltage $V_{PIN}$ and a negative input terminal 57 for receiving a negative differential input voltage $V_{NIN}$. The driver circuit 50 also includes an NMOS transistor 60 having a source connected to the ground rail 53 and a drain connected to the sources of transistors 56 and 58. The driver circuit further includes PMOS transistors 52 and 54 having their gates connected together and their sources connected to the voltage supply rail 51. The drain of transistor 52 is connected to the drain of transistor 56, and the drain of transistor 54 is connected to the drain of transistor 58. The driver circuit 50 has bias input terminals 62 and 64 for receiving input bias currents, and output terminals 66 and 68 for providing output drive currents to the load 70.

The load 70 includes four resistors 72, 74, 76 and 78. Resistors 72 and 74 have the same resistance value $R_1$, and resistors 76 and 78 have the same resistance value $R_2$. Resistor 72 is connected between the voltage supply rail 51 and a node 73. Resistor 76 is connected between the node 73 and the ground rail 53. Resistor 74 is connected between the voltage supply rail 51 and a node 75. Resistor 78 is connected between the node 75 and the ground rail 53. The nodes 73 and 75 of load 70 are respectively connected to the output terminals 66 and 68 of the driver circuit 50 to receive output drive currents from the drive circuit. Nodes 73 and 75 of load 70 are also connected respectively to output terminals 77 and 79 for respectively providing output voltages $V_{POUT}$ and $V_{NOUT}$.

The bias circuit 80 includes a two-bit digital-to-analog converter 82 that provides a programmable reference current. The digital-to-analog converter 82 has two input terminals 81 and 83 for receiving digital signals that select an output reference current of the digital-to-analog converter.. The digital-to-analog converter is connected to an NMOS transistor 84 having its drain connected to its gate and its source connected to the ground rail 53. The bias circuit 80 further includes an NMOS transistor 86 having a gate connected to the gate of transistor 84, a source connected to the ground rail, and a drain connected to the drain of a PMOS transistor 88. PMOS transistor 88 has a source connected to the voltage supply rail 51 and a gate connected to input terminal 62 of the driver circuit 50. The gate of transistor 86 is also connected to input terminal 64 of the driver circuit 50.

The operation of the circuit shown in FIG. 4 will now be described. Each of transistors 52, 54 and 60 of the driver circuit 50 acts as a current source for providing a current $I_1$ as shown in FIG. 4. A value of the current $I_1$ is determined by the bias circuit 80 as described below. Transistors 52 and 54 are mirror-connected to transistor 88 of the bias circuit such that the current $I_1$, which flows through transistors 52 and 54, is equal to a current $I_2$, which flows through transistor 88, multiplied by a mirror ratio determined by the relative geometries of transistors 52, 54 and 88, as will be understood by those skilled in the art. Transistor 60 is mirror-connected to transistor 86 such that the value of the current $I_1$ through transistor 60 is equal to the current $I_2$ through transistor 86 multiplied by a mirror ratio determined by the relative geometries of transistors 60 and 86. Transistor 86 is mirror-connected to transistor 84 such that the current $I_2$, which flows through transistor 86, is equal to the current $I_0$, which flows through transistor 84, multiplied by a mirror ratio determined by the relative geometries of transistors 84 and 86. The current $I_0$, which flows through transistor 84, is the output current of the digital-to-analog converter 82. Because of the mirror connections of the transistors described above, the output current $I_0$ of the digital-to-analog converter (DAC) 82 controls the current $I_1$ flowing through each of transistors 52, 54 and 60. The output current $I_0$ of the DAC is determined by a two-bit digital word provided at inputs 81 and 83 of the DAC. Accordingly, the two bit word input to the DAC can be used to control the current $I_1$ through transistors 52, 54 and 60.

Input terminals 55 and 57 of the driver circuit 50 receive a differential input signal. Depending on the polarity of the differential input signal, one of transistors 56 and 58 will be turned on such that a current $I_1$ will flow through the transistor that is turned on, and the other of transistors 56 and 58 will be turned off. If, for example, a differential signal having a positive polarity is received by the driver circuit 50, then transistor 56 will be turned on and transistor 58 will be turned off. When transistor 56 is turned on, the current $I_1$ from transistor 52 will flow through transistors 56 and 60 to the ground rail 53. In this example, transistor 58 is turned off, and the current $I_1$ through transistor 54 is produced at the output terminal 68. With transistor 56 turned on, the current $I_1$ from transistor 52 is passed through transistor 56 such that there is no output current at output terminal 66. Similarly, when transistor 56 is off and transistor 58 is on, an output current equal to $I_1$ is available at output terminal 68, and there is no output current at output terminal 66.

The load 70 provides an input impedance $Z_0$ at nodes 73 and 75 with respect to ground, where $Z_0$ is defined by equation (7) below.

$$Z_O = \frac{R_1 R_2}{R_1 + R_2}$$

The output voltage $V_{POUT}$ at terminal 77 for a positive, or high, state of the differential input signal is given by equation (7) below.

$$\text{(HIGH)} \quad V_{POUT} = V_{DD} - V_{DD} \frac{R_1}{R_1 + R_2} + I_1 Z_O \quad (7)$$

The output voltage $V_{POUT}$ at terminal 77 for a negative, or low, state of the differential input signal is given by equation (8) below.

$$\text{(LOW)} \quad V_{POUT} = V_{DD} - V_{DD} \frac{R_1}{R_1 + R_2} \quad (8)$$

The output voltage $V_{NOUT}$ at terminal 79 of load 70 is as provided by equations (7) and (8) for respectively a negative differential input (Low) and a positive differential input (High).

By appropriately selecting values of $R_1$ and $R_2$ and the current $I_4$, the output voltages $V_{POUT}$ and $V_{NOUT}$ can be set to be within the allowable positive ECL voltages provided by equations (3) and (4). In one embodiment of the invention, $R_1$ has a value of 160 ohms, $R_2$ has a value of 260 ohms, $V_{DD}$ is 5 volts, and $I_1$ equals 10 milliamps. The resulting output voltages for this embodiment for respectively a positive and a negative differential input signal are approximately 4.1 volts and 3.1 volts for a value of 5 volts. The value of $I_1$ can be adjusted using DAC 82 to accommodate different load impedances $Z_o$.

Figure 5:
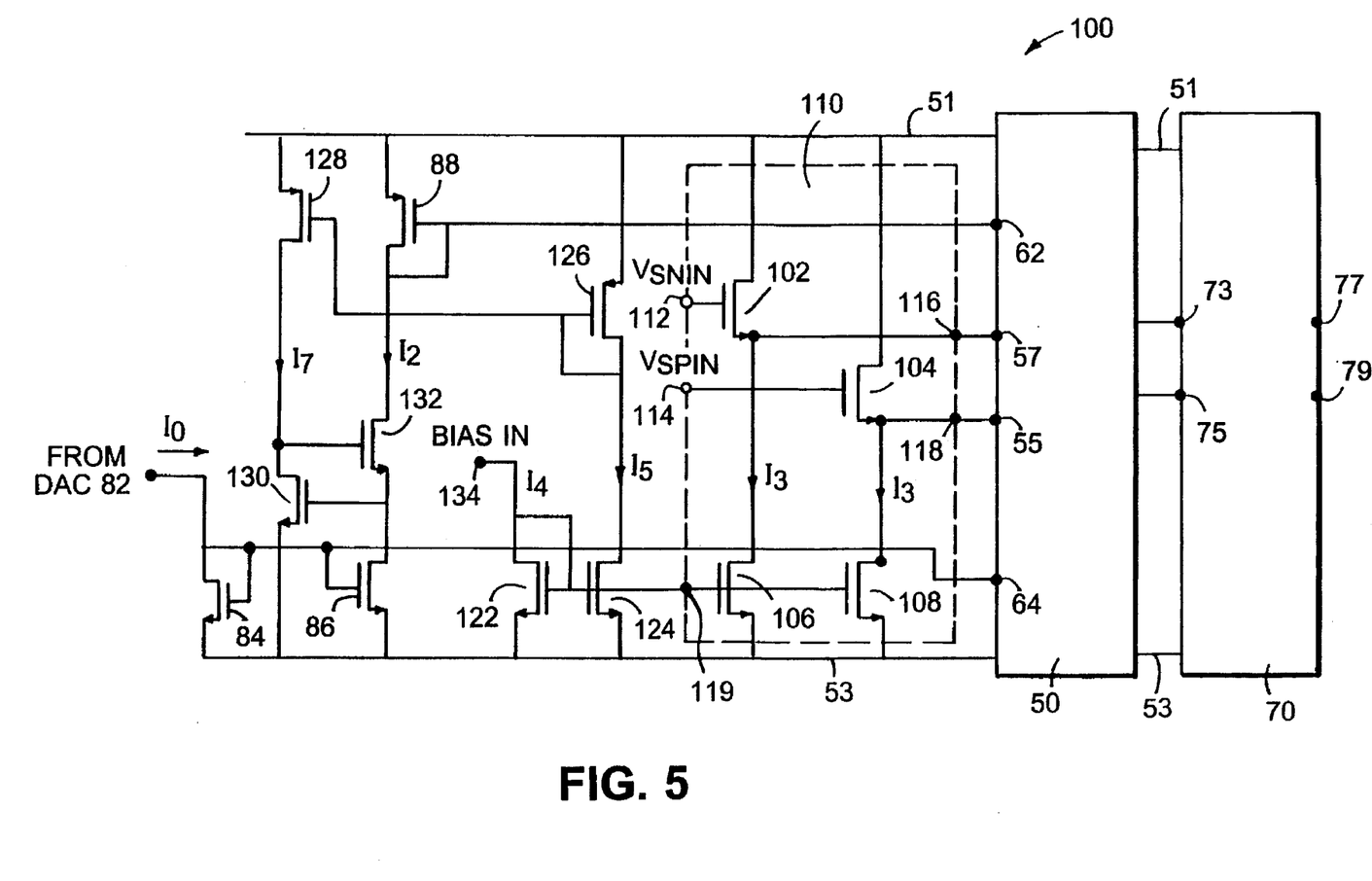
FIG. 5 is a schematic diagram of a differential high speed output driver circuit in accordance with a second embodiment of the present invention.

Another embodiment of the present invention is shown in FIG. 5. The circuit 100 shown in FIG. 5 consists of the load 70 of FIG. 4, the driver circuit 50 of FIG. 4, and the bias circuit 80 of FIG. 4. The circuit 100 further includes a level shifting circuit 110 and a temperature compensated bias circuit. The level shifting circuit 110 includes NMOS transistors 102, 104, 106 and 108, input terminals 112 and 114, output terminals 116 and 118, and bias input terminal 119. Transistor 102 has a drain connected to the voltage supply rail 51, a gate connected to the input terminal 112, and a source. Transistor 104 has a drain connected to the voltage supply terminal 51, a gate connected to the input terminal 114, and a source. Transistor 106 has a drain connected to the source of transistor 102, a source connected to the ground rail 53, and a gate connected to the input bias terminal 119. Transistor 108 has a drain connected to the source of transistor 104, a source connected to the ground rail, and a gate connected to the input bias terminal 119. The output terminals 116 and 118 of the level shifting circuit 110 are respectively coupled to the sources of transistors 102 and 104. Also, the output terminals 116 and 118 are respectively coupled to the input terminals 55 and 57 of the driver circuit 50.

The temperature-compensated bias circuit includes NMOS transistors 122, 124, 130, and 132 and PMOS transistors 126 and 128 and an input terminal 134. Transistor 122 has a drain and a gate connected to the input terminal 134 and a source connected to the ground rail. Transistor 124 has a gate connected to the gate of transistor 122, a source connected to the ground rail and a drain. Transistor 126 has a drain connected to a gate, and a source connected to the voltage supply rail. The drain of transistor 126 is also connected to the drain of transistor 124. Transistor 128 has a gate connected to the gate of transistor 126 and a source connected to the voltage supply rail and a drain. Transistor 130 has a drain connected to the drain of transistor 128, a source connected to the ground rail and a gate. Transistor 132 has a gate connected to the drain of transistor 130, a drain connected to the drain of transistor 88, and a source connected to the gate of transistor 130 and connected to the drain of transistor 86.

The operation of the circuit shown in FIG. 5 will now be described. The drive circuit 50, the load 70, and the bias circuit 80 operate in the same manner as in the embodiment shown in FIG. 3, previously described. The level shifting circuit 100 allows a greater range of input signals to be received by circuit 100 than can be received by the driver circuit 70 alone. The level shifting circuit 100 reduces the voltage with respect to the ground rail of each of the positive and negative input differential signals by a value equal to the gate to source voltage $V_{GS}$ of transistors 102 and 104. The voltage $V_{GS}$ of each of transistors 102 and 104 is controlled by the current $I_3$ flowing through transistors 106 and 108. By controlling the current $I_3$, the voltage drop $V_{GS}$ of each of transistors 102 and 104 can be controlled, thereby controlling the amount of level shifting provided by the level shifting circuit 110.

Transistors 106 and 108 are mirror connected to transistor 122 of the temperature-compensated bias circuit such that the current $I_3$ flowing through transistors 106 and 108 is equal to the current $I_4$ flowing through transistor 122 multiplied by a mirror ratio determined by the relative geometries of the transistors. The current $I_4$ flowing through transistor 122 is the input bias current received at terminal 134. In a preferred embodiment, the input current at terminal 134 has a constant value independent of temperature.

Transistors 122, 124, 126, 128, 130, and 132 of the temperature-compensated bias circuit are used to regulate the bias currents provided from the DAC 82 to ensure that current $I_1$ flowing through transistors 52 and 54, shown in FIG. 4, remains constant over temperature. The temperature-compensated bias circuit achieves this as follows. The current $I_5$ flowing through transistors 126 and 124 is equal to current $I_4$ multiplied by a mirror ratio determined by the relative geometries of transistors 124 and 122. Similarly, the current $I_7$ flowing through transistor 128 is equal to the current $I_5$ multiplied by a mirror ratio determined by the relative geometries of transistors 128 and 126. Transistors 130 and 132 essentially provide a feedback circuit whereby transistor 130 senses the current $I_2$ flowing through transistor 132 and, in response, provides a control voltage to the base of transistor 132 to control current $I_2$. As described above with reference to FIG. 4, the current $I_1$ is proportional to current $I_2$. Therefore, current $I_1$ can be regulated by regulating current $I_2$ using the temperature-compensated bias circuit.

Figure 6:
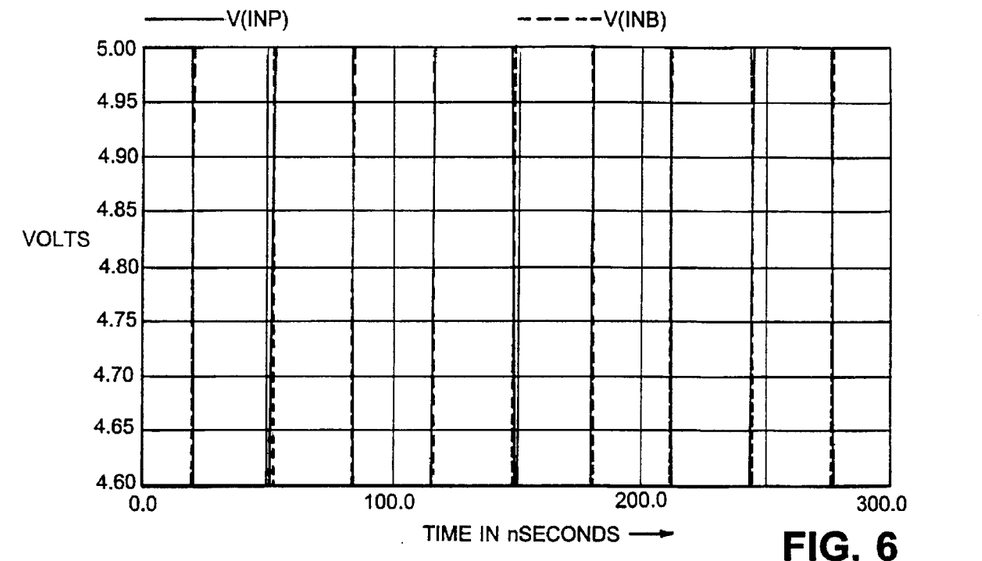
FIG. 6 is a diagram showing computer simulation results of the embodiment of the present invention shown in FIG. 5.
Figure 7:
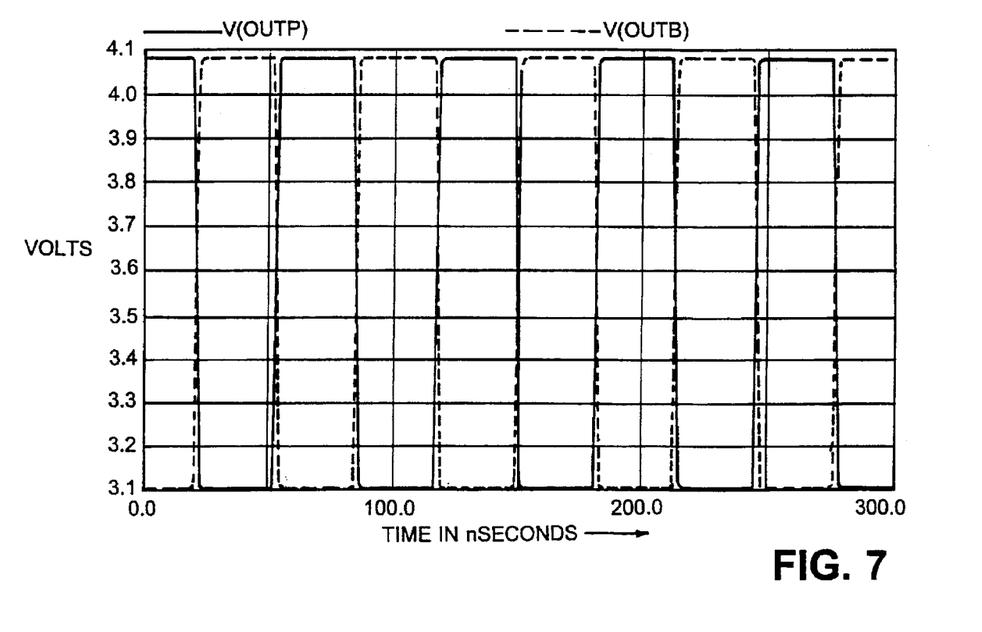
FIG. 7 is a diagram showing computer simulation results of the embodiment of the present invention shown in FIG. 5.

A computer simulation was performed on the circuit shown in FIG. 5 using ADICE, a proprietary, software circuit simulation tool, developed by Analog Devices Inc., Norwood MA., based on the software circuit simulation tool SPICE that is well-known to those skilled in the art. FIG. 6 shows input waveforms, V(INP) and V(INB) applied respectively to input terminals 114 and 112. FIG. 6 shows the voltage values of the input signals with respect to the voltage at the ground rail of the driver circuit. FIG. 7 shows output waveforms V(OUTP) and V(OUTB) that are the resulting output waveforms at terminals 77 and 79 respectively. The output voltage values are the voltages with respect to the ground rail of the driver circuit. The output voltages shown in FIG. 7 are within the typical ECL output voltage levels provided by equations (3) and (4) with $V_{DD}$ equal to 5 volts.

In embodiments of the invention described above, a two-bit digital-to-analog converter has been described for providing a programmed output current. As should be understood by one skilled in the art, other digital-to-analog converters could be used for this application, including digital-to-analog converters having an input word length other than two bits.

In describing embodiments of the invention herein, equations have been used to show that particular values, for example an output voltage value, is based on a relationship of other values. As understood by one skilled in the art, these equations represent approximations. Parasitic values, for example voltage drops associated with a current flow through interconnecting leads between components, are not considered in the equations for simplification of the equations.

In the embodiments of the invention described above, differential driver circuits having differential inputs and outputs have been described. As will be understood by one skilled in the art, the present invention is also applicable to single-ended driver circuits.

Having thus described illustrative embodiments of the invention, there are alterations, modifications and improvements that would readily occur to those skilled in the art. Such alterations, modifications and improvements are intended to be within the scope and spirit of the invention. Accordingly, the foregoing description is by way of example only and not intended as limiting. The invention is limited only as defined in the following claims and the equivalents thereto.

What is claimed is:

1. A driver circuit, having first and second reference voltage rails for receiving first and second reference voltages, that receives an input differential signal and provides an output differential signal to a lead, the driver circuit comprising:

a differential amplifier having first and second inputs that receive the input differential signal, first and second outputs that provide the output differential signal, each of the first and second outputs providing an output drive current having an output current value, and first and second control inputs that respectively receive first and second control signals having first and second control values, the output current value of each of the first and second outputs being determined by the control values of the first and second control signals and the input differential signal; and a programmable bias circuit, having an input that receives a programming signal and first and second outputs that provide respectively the first and second control signals, the first and second control values of the first and second control signals being determined by the programming signal, the first and second outputs of the programmable bias circuit being respectively coupled to the first and second control inputs of the differential amplifier to provide the first and second control signals, wherein the differential amplifier includes:

a first CMOS transistor having a first terminal that is a control input, coupled to the first input of the differential amplifier, and having second and third terminals;

a second CMOS transistor having a first terminal that is a control input, coupled to the second input of the differential amplifier, and having second and third terminals;

a first current source, coupled between the first reference voltage rail and the second terminal of the first CMOS transistor, and coupled to the first control input of the differential amplifier to receive the first control signal, a value of current through the first current source being determined by the first control value;

a second current source, coupled between the first reference voltage rail and the second terminal of the second CMOS transistor, and coupled to the first control input of the differential amplifier to receive the first control signal, a value of current through the second current source being determined by the first control value;

a third current source, coupled between the second reference rail and the third terminals of the first and second CMOS transistors, and coupled to the second control input of the differential amplifier to receive the second control signal, a value of current through the third current source being determined by the second control value; and wherein the second terminal of the first CMOS transistor is coupled to the first output of the differential amplifier, and the second terminal of the second CMOS transistor is coupled to the second output of the differential amplifier to provide the output differential signal.

2. The driver circuit of claim 1, wherein the driver circuit is constructed and arranged such that the output current value of each of the first and second outputs of the differential amplifier generates a voltage in the load with respect to the first voltage that is within typical emitter coupled logic output voltage ranges.

3. The driver circuit of claim 2, wherein the driver circuit is constructed and arranged such that the output current value of each of the first and second outputs of the differential amplifier is a function of the value of the current through the current sources and the programmable bias circuit can be programmed such that the output current value at each of the outputs of the differential amplifier generates voltages in the load that are within typical emitter coupled logic output voltage ranges for different load impedance values.

4. The driver circuit of claim 3, further comprising a level shifting circuit having first and second inputs that receive the input differential signal and having first and second outputs respectively coupled to the control input of the first and second CMOS transistors, the level shifting circuit providing a voltage level shift to the input differential signal.

5. The driver circuit of claim 4, further comprising a current bias circuit, coupled to the programmable bias circuit and the first, second and third current sources, that regulates the value of the current through each of the first, second and third current sources.

6. The driver circuit of claim 5, wherein the programmable bias circuit includes a digital to analog converter.

7. The driver circuit of claim 6, wherein each of the first, second and third current sources includes a CMOS transistor.

8. The driver circuit of claim 1, wherein the driver circuit is constructed and arranged such that the output current value of each of the first and second outputs of the differential amplifier is a function of the value of the current through the current sources and the programmable bias circuit can be programmed such that the output current value at each of the outputs of the differential amplifier generates voltages in the load that are within typical emitter coupled logic output voltage ranges for different load impedance values.

9. The driver circuit of claim 1, further comprising a level shifting circuit having first and second inputs that receive the input differential signal and having first and second outputs respectively coupled to the control input of the first and second CMOS transistors, the level shifting circuit providing a voltage level shift to the input differential signal.

10. The driver circuit of claim 1, further comprising a current bias circuit, coupled to the programmable bias circuit and the first, second and third current sources, that regulates the value of the current through each of the first, second and third current sources.

11. The driver circuit of claim 1, wherein each of the first, second and third current sources includes a CMOS transistor.

12. A driver circuit, having first and second reference voltage rails for receiving first and second reference voltages, that receives an input differential signal and provides an output differential signal to a load, the driver circuit comprising:

a differential amplifier having first and second inputs that receive the input differential signal, first and second outputs that provide the output differential signal, each of the first and second outputs providing an output drive current having an output current value, and first and second control inputs that respectively receive first and second control signals having first and second control values, the output current value of each of the first and second outputs being determined by the control values of the first and second control signals and the input differential signal; and a programmable bias circuit, having an input that receives a programming signal and first and second outputs that provide respectively the first and second control signals, the first and second control values of the first and second control signals being determined by the programming signal, the first and second outputs of the programmable bias circuit being respectively coupled to the first and second control inputs of the differential amplifier to provide the first and second control signals, wherein the differential amplifier is implemented using only CMOS technology.

13. A driver circuit, having first and second reference voltage rails for receiving first and second reference voltages, that receives an input differential signal and provides an output differential signal to a load, the driver circuit comprising:

a differential amplifier having first and second inputs that receive the input differential signal, first and second outputs that provide the output differential signal, each of the first and second outputs providing an output drive current having an output current value, and first and second control inputs that respectively receive first and second control signals having first and second control values, the output current value of each of the first and second outputs being determined by the control values of the first and second control signals and the input differential signal; and a programmable bias circuit, having an input that receives a programming signal and first and second outputs that provide respectively the first and second control signals, the first and second control values of the first and second control signals being determined by the programming signal, the first and second outputs of the programmable bias circuit being respectively coupled to the first and second control inputs of the differential amplifier to provide the first and second control signals, wherein the programmable bias circuit includes a digital to analog converter.

14. A CMOS integrated circuit having first and second voltage rails for respectively receiving first and second reference voltages, the integrated circuit comprising:

a processor; and an output driver circuit, coupled to the processor to receive an input differential signal, having first and second outputs for providing an output differential signal having output drive currents to a load, the output drive currents having a programmable value such that output voltages at the load with respect to the first reference voltage are within typical emitter coupled logic output voltage ranges;

wherein the output driver circuit is implemented using only CMOS technology, wherein the output driver circuit includes:

a differential amplifier having first and second inputs that receive the input differential signal, first and second outputs, coupled to the first and second outputs of the driver circuit, that provide the output differential signal, each of the first and second outputs of the differential amplifier providing an output drive current having an output current value, and first and second control inputs that respectively receive first and second control signals having first and second control values, the output current value of each of the first and second outputs of the differential amplifier being determined by the control values of the first and second control signals; and a programmable bias circuit, having an input that receives a programming signal and first and second outputs that provide respectively the first and second control signals, the first and second control values of the first and second control signals being determined by the programming signal, the first and second outputs of the programmable bias circuit being respectively coupled to the first and second control inputs of the differential amplifier to provide the first and second control signals.

15. The integrated circuit of claim 14, wherein the differential amplifier includes:

a first CMOS transistor having a first terminal that is a control input, coupled to the first input of the differential amplifier, and having second and third terminals;

a second CMOS transistor having a first terminal that is a control input, coupled to the second input of the differential amplifier, and having second and third terminals;

a first current source, coupled between the first reference voltage rail and the second terminal of the first CMOS transistor, and coupled to the first control input of the differential amplifier to receive the first control signal, a value of current through the first current source being determined by the first control value;

a second current source, coupled between the first reference voltage rail and the second terminal of the second CMOS transistor, and coupled to the first control input of the differential amplifier to receive the first control signal, a value of current through the second current source being determined by the first control value;

a third current source, coupled between the second reference voltage rail and the third terminals of the first and second CMOS transistors, and coupled to the second control input of the differential amplifier to receive the second control signal, a value of current through the third current source being determined by the second control value; and wherein the second terminal of the first CMOS transistor is coupled to the first output of the differential amplifier, and the second terminal of the second CMOS transistor is coupled to the second output of the differential amplifier to provide the output differential signal.

16. The integrated circuit of claim 15, wherein the driver circuit is constructed and arranged such that the output current value of each of the first and second outputs of the driver circuit is a function of the value of the current through the current sources and the programmable bias circuit can be programmed such that the output current value generates voltages in the load that are within typical emitter coupled logic output voltage ranges for different load impedance values.

17. The integrated circuit of claim 14, wherein the output driver circuit further includes a level shifting circuit having first and second inputs respectively coupled to the first and second inputs of the output driver circuit and having first and second outputs respectively coupled to the first and second inputs of the differential amplifier, the level shifting circuit providing a voltage level shift to the input differential signal.

18. The integrated circuit of claim 15, further comprising a current bias circuit, coupled to the programmable bias circuit and the first, second and third current sources, that regulates the value of the current through each of the first, second and third current sources.

19. The integrated circuit of claim 14, wherein the programmable bias circuit includes a digital to analog converter.

20. The integrated circuit of claim 15, wherein each of the first, second and third current sources include a CMOS transistor.

21. A driver circuit, having first and second reference voltage rails for receiving first and second reference voltages, that receives an input signal and provides an output signal to a load, the driver circuit comprising:

an amplifier having an input that receives the input signal and an output that provides the output signal having an output current value, and first and second control inputs that respectively receive first and second control signals having first and second control values, the output current value being determined by the control values of the first and second control signals; and a programmable bias circuit, having an input that receives a programming signal and a first and second outputs that respectively provide the first and second control signals, the first and second control values of the control signals being determined by the programming signal, the first and second outputs of the programmable bias circuit being respectively coupled to the first and second control inputs of the amplifier to provide the first and second control signals, wherein the amplifier is implemented using only CMOS technology.

22. The driver circuit of claim 21, wherein the driver circuit is constructed and arranged such that the output current value generates a voltage in the load with respect to the first reference voltage that is within typical emitter coupled logic output voltage ranges.

* * * * *